US009543203B1

(12) United States Patent
Lu et al.

(10) Patent No.: US 9,543,203 B1
(45) Date of Patent: Jan. 10, 2017

(54) METHOD OF FABRICATING A SEMICONDUCTOR STRUCTURE WITH A SELF-ALIGNED CONTACT

(71) Applicant: UNITED MICROELECTRONICS CORP., Hsin-Chu (TW)

(72) Inventors: Chia-Lin Lu, Taoyuan (TW);
Chun-Lung Chen, Tainan (TW);
Kun-Yuan Liao, Hsin-Chu (TW);
Feng-Yi Chang, Tainan (TW);
En-Chiuan Liou, Tainan (TW);
Chia-Hsun Tseng, Tainan (TW);
Wei-Hao Huang, New Taipei (TW);
Yu-Ting Hung, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/791,242

(22) Filed: Jul. 2, 2015

(51) Int. Cl.
*H01L 21/3205* (2006.01)
*H01L 29/66* (2006.01)
*H01L 21/768* (2006.01)
*H01L 21/311* (2006.01)
*H01L 21/027* (2006.01)

(52) U.S. Cl.
CPC ..... *H01L 21/76897* (2013.01); *H01L 21/0276* (2013.01); *H01L 21/31133* (2013.01); *H01L 21/31144* (2013.01); *H01L 21/76802* (2013.01); *H01L 21/76843* (2013.01); *H01L 21/76877* (2013.01); *H01L 29/6656* (2013.01); *H01L 29/66545* (2013.01)

(58) Field of Classification Search
CPC ............. H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC .......... 257/20, 194, 135–136, 213–413, 900, 257/902–903; 438/136, 137, 156, 173, 438/192, 206, 212, 424, 427, 428, 591
See application file for complete search history.

(56) References Cited

U.S. PATENT DOCUMENTS

| 7,250,371 | B2 | 7/2007 | Kang | |
| 7,449,230 | B2 | 11/2008 | Sabnis | |
| 7,772,122 | B2 | 8/2010 | Cirigliano | |
| 8,883,648 | B1 | 11/2014 | Hsieh | |
| 2005/0136649 | A1* | 6/2005 | Lee | H01L 21/76897 438/637 |
| 2007/0284690 | A1 | 12/2007 | Sadjadi | |
| 2009/0014796 | A1 | 1/2009 | Liaw | |
| 2009/0130850 | A1 | 5/2009 | Lee | |
| 2009/0191711 | A1 | 7/2009 | Rui | |
| 2010/0009531 | A1* | 1/2010 | Choi | H01L 21/28273 438/643 |
| 2013/0175629 | A1 | 7/2013 | Chang | |

(Continued)

*Primary Examiner* — Julio J Maldonado
*Assistant Examiner* — Moin Rahman
(74) *Attorney, Agent, or Firm* — Winston Hsu; Scott Margo

(57) ABSTRACT

A method of fabricating a semiconductor structure includes the following steps: forming a first interlayer dielectric on a substrate; forming a gate electrode on the substrate so that the periphery of the gate electrode is surrounded by the first interlayer dielectric; forming a patterned mask layer comprising at least a layer of organic material on the gate electrode; forming a conformal dielectric layer to conformally cover the layer of organic material; and forming a second interlayer dielectric to cover the conformal dielectric layer.

14 Claims, 6 Drawing Sheets

(56) References Cited

U.S. PATENT DOCUMENTS

2014/0017899 A1    1/2014  Wallace
2014/0217482 A1*   8/2014  Xie .................. H01L 21/28114
                                                      257/288

* cited by examiner

METHOD OF FABRICATING A SEMICONDUCTOR STRUCTURE WITH A SELF-ALIGNED CONTACT

BACKGROUND OF THE INVENTION

1. Field of the Invention

The present invention relates generally to the field of semiconductor devices, and more particularly to a method of fabricating a semiconductor structure having a metal electrode and a self-aligned contact (SAC).

2. Description of the Prior Art

Along with the continuous miniaturization of the Integrated Circuits (IC), the feature sizes of semiconductor devices within the ICs are also scaled down continuously. In order to overcome electrical or processing limitations arising from the miniaturization of semiconductor devices, semiconductor manufacturers have found several solutions. For example, for a transistor device with a polysilicon gate, some disadvantages, such as boron penetration and depletion effect often occur and cause inferior performance of the transistor device. In order to solve these drawbacks, some semiconductor manufacturers adopt a gate-last process to replace the conventional polysilicon gate with a metal gate having metal electrode. Additionally, along with the shrinkage between two adjacent gate structures, semiconductor manufacturers also correspondingly invent a method for self-aligning a contact structure so as to overcome drawbacks due to the insufficient space between the two adjacent gate structures.

For a transistor device having both the metal gate and the self-aligned contact structure, a mask layer is often formed to cover the metal gate prior to the formation of the self-aligned contact structure. In the case where the gate electrode is covered by the mask layer, even though the self-aligned contact structure is formed close to the metal gate, there is still no unnecessary contact between them.

However, even though the above-mentioned self-aligned contact structure is widely used to present unnecessary electrical connection, there is still a problem that needs to be overcome. For example, because the width of the mask layer is often equal to or less than the width of the underlying metal gate electrode, the self-aligned contact structure is still able to be in direct contact with the lateral of the adjacent metal gate electrode during the process of forming the self-aligned contact structure.

Accordingly, in order to overcome the above-mentioned problem, there is still a need to provide a method of fabricating a semiconductor structure having a metal gate and a self-aligned contact structure.

SUMMARY OF THE INVENTION

One object of the present invention is to provide a method of fabricating a semiconductor structure having a metal gate and a self-aligned contact structure so as to solve the problem in conventional technologies.

According to one preferred embodiment of the present invention, a method of fabricating a semiconductor structure is disclosed and includes the following steps: forming a first interlayer dielectric on a substrate; forming a gate electrode on the substrate so that the periphery of the gate electrode is surrounded by the first interlayer dielectric; forming a patterned photoresist to cover a top surface of the gate electrode; and forming a second interlayer dielectric to cover a top surface and sidewalls of the patterned photoresist.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
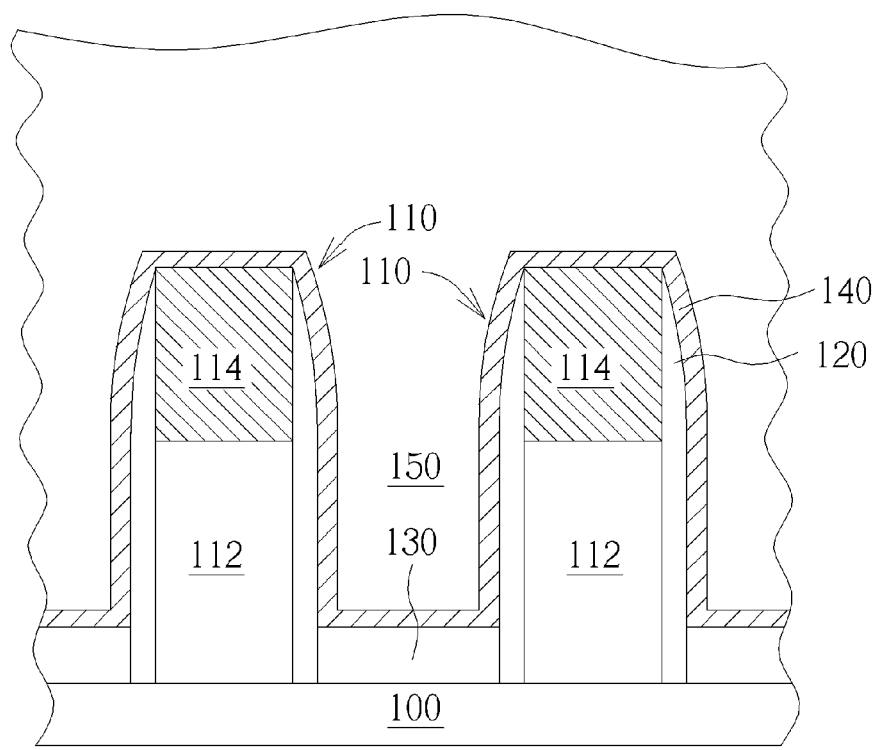
FIG. 1 is a schematic diagram showing a semiconductor structure at the beginning of the fabrication process according to a first embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

Spatially relative terms, such as "inner," "outer," "beneath," "below," "lower," "above," "upper" and the like, may be used herein for ease of description to describe one element and/or feature's relationship to another element(s) and/or feature(s) as illustrated in the figures. Spatially relative terms may be intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, processes for fabricating a semiconductor device having a transistor structure and a contact structure are described in detail. FIG. 1 to FIG. 9 are schematic cross-sectional diagrams showing a method for fabricating a semiconductor device according to a first preferred embodiment of the present invention. Please refer to FIG. 1. FIG. 1 is a schematic diagram showing a semiconductor structure at the beginning of the fabrication process. A substrate having stack structures, spacers, epitaxial layers, doped regions, cap layers and dielectric layers disposed thereon or therein is provided. For example, the substrate 100 may be a semiconductor substrate with several protruding fin structures on its surface, but not limited thereto. The stack structures may be dummy gate structures 110, each of which may be composed of an interfacial layer (not shown), a dummy gate electrode 112 and a cap layer 114 stacked from bottom to top. The spacers may be gate spacers 120 respectively disposed on the sidewalls of each of the dummy gate structures 110. The epitaxial layers 130 are disposed inside or outside the substrate 100 and are respectively disposed on each side of the dummy gate structure 110, but not limited thereto. The doped regions (not shown) may be, for example, lightly-doped drains (LDD) and/or source/drain regions and are respectively disposed on each side of each dummy gate structure 110. Besides, the doped regions may be optionally located in the substrate 100 or the epitaxial layers 130, but not limited thereto. Additionally, an etch stop layer 140 may conformally cover the gate spacers 120, the epitaxial layers 130 and the cap layer 114.

The above-mentioned substrate 100 may be selected from a silicon substrate, silicon-germanium substrate or silicon-on-insulator (SOI) substrate, but not limited thereto. In a case where the surface of the substrate 100 has protruding fin structures, segments of these fin structures may be covered by the corresponding dummy gate structures 110. The interfacial layer (not shown), the dummy gate electrode 112 and the cap layer 114 in each dummy gate structure 110 may be respectively made of silicon oxide, polysilicon and silicon nitride, but not limited thereto. The gate spacers 120 may be selected from the group consisting of silicon nitride, silicon carbide, silicon carbon nitride, silicon oxynitride or other suitable semiconductor compounds. The epitaxial layers 130 disposed at two sides of the dummy gate structures 110 may be selected from doped or un-doped semiconductor materials, such as silicon germanium, silicon phosphor, silicon carbon or the like. The epitaxial layers 130 may apply required stress to adjacent channel regions in the fin structures so as to improve the carrier mobility in the channel regions. The etch stop layer 140 may be selected from the group consisting of silicon carbon nitride, silicon oxynitride, silicon nitride, silicon carbide or other suitable semiconductor compounds. The etch stop layer 140 may also impose required stress on the channel regions and/or act as an etch stop layer in the following process of forming a self-aligned contact structure. The first interlayer dielectric 150 may be selected from non-conductive dielectric materials such as silicon oxide or the like.

Then, a planarization process and/or an etching process is carried out, such as a chemical mechanical polishing process, to sequentially remove the first interlayer dielectric 150 and the etch stop layer 140 above the cap layer 114 until a top surface of the cap layer 114 is exposed. Afterwards, the cap layer 114 above the dummy gate electrode 112 may be further removed by applying another planarization process and/or etching process may be carried out. Then, an etching process may be carried out to remove the dummy gate electrode 112 completely so as to leave trenches in the first interlayer dielectric 150.

Figure 2:
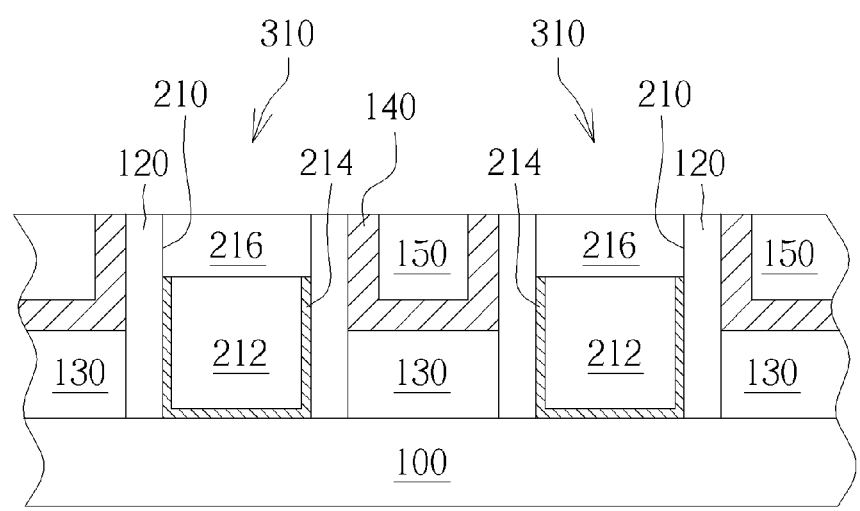
FIG. 2 is a schematic diagram showing a semiconductor structure after carrying out a replacement metal gate process according to a first embodiment of the present invention.

Please refer to FIG. 2. FIG. 2 is a schematic diagram showing a semiconductor device after carrying out a replacement metal gate process. After the process of completely removing the dummy gate electrode 112 and leaving the trenches 210 in the first interlayer dielectric 150, a replacement metal gate (RMG) process may be carried out so as to form a structure as shown in FIG. 2. The RMG process may include at least the following steps. A dielectric layer 214, a work function metal layer and a conductive layer is sequentially filled into a trench 210. A polishing process is then carried out to remove the dielectric layer 214, the work function metal layer and the conductive layer outside the trench 210 until the first interlayer dielectric layer 150 is exposed. Afterwards, portions of the dielectric layer 214, the work function metal layer and the conductive layer may be further removed so as to expose a top portion of the trench 210. The exposed trench 210 may be further refilled with hard mask 216 made of non-conductive dielectric material in a deposition and planarization process. At this time, several metal gate structures 310 are obtained, and the conductive layer in trenches 210 may act as gate electrodes 212 of the metal gate structures 310.

The dielectric layer 214 disclosed above is preferably a high-k dielectric layer with a dielectric constant substantially greater than 20. As an example, the dielectric layer 214 could be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto. Additionally, the work function metal layers include titanium nitride (TiN), titanium carbide, (TiC), tantalum nitride (TaN), tantalum carbide (TaC), tungsten carbide (WC) or aluminum titanium nitride (TiAlN), but not limited thereto. The gate electrodes 152 may include metal or metal oxide with superior filling ability and relative low resistance, such as aluminum (Al), titanium aluminum (TiAl), titanium aluminum oxide (TiAlO), tungsten (W) or copper (Cu), but not limited thereto.

Additionally, since the above-mentioned process is agate-last process accompanied with a high-k last process, both the dielectric layer 214 and the work function layer are preferably disposed on the sidewalls and the bottom of each trench 210. However, the present embodiment is not limited thereto. In other words, a gate-first process accompanied with a high-k first process may be applied instead. In this way, prior to the removal of the dummy gate electrode, the substrate 100 within the trench 210 may be covered by the high-k dielectric layer. In addition, a barrier layer (not shown) may be optionally formed and may cover the high-k dielectric layer so that the high-k dielectric layer is not removed along with the sacrificial layer. The barrier layer may be a metal layer, such as a titanium nitride layer.

Figure 3:
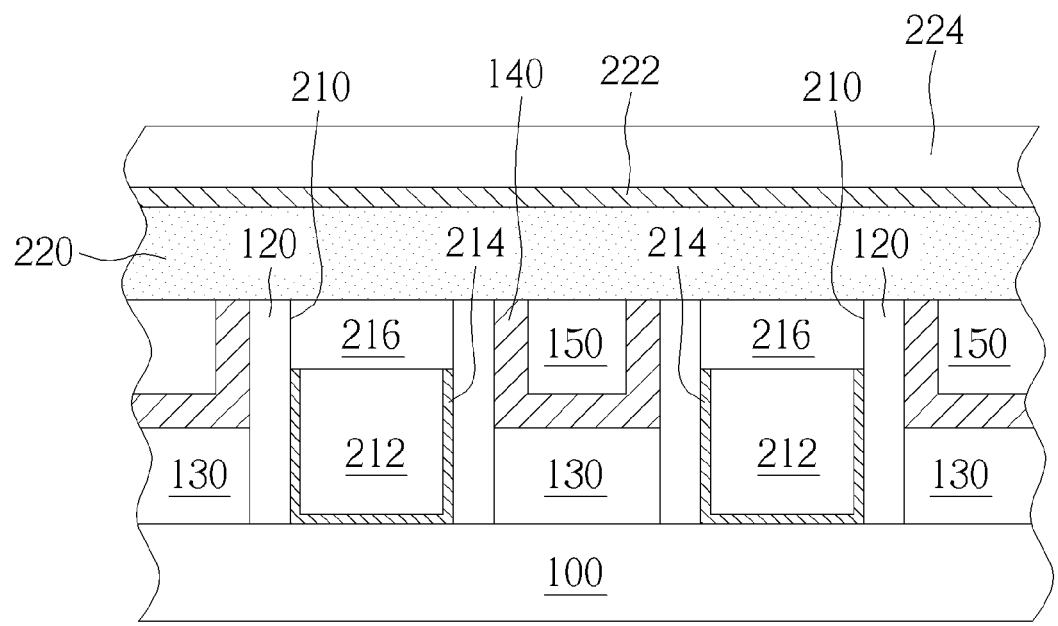
FIG. 3 is a schematic diagram showing a semiconductor structure after coating a multi-layered structure on the substrate according to a first embodiment of the present invention.

Please refer to FIG. 3. FIG. 3 is a schematic diagram showing a semiconductor structure after coating a multi-layered structure on the substrate. After the step shown in FIG. 2, a mask structure is coated or deposited on the surface of the surface of the first interlayer dielectric 150 and hard masks 216. The mask structure may be a single-layered, double-layered or multi-layered structure with a least a layer of organic material. For example, in a case where the mask structure is a tri-layered structure, three layers such as an organic dielectric layer 220, an anti-reflection layer 222 and a photoresist layer 224, may be sequentially coated and/or deposited on the surface of the first interlayer dielectric 150 and hard masks 216 after the step shown in FIG. 2. The organic dielectric layer 220 preferably has a flat surface on which the anti-reflection layer 222 and the photoresist layer 224 can be disposed. In this way, the thickness of the photoresist layer 224 can be kept the same in different regions over the substrate 100. Additionally, the anti-reflection layer 222 may be silicon-containing hard-mask bottom anti-reflection coating, which can be used to prevent reflected light from re-entering the photoresist layer 224. As shown in FIG. 3, the layers disposed on the first interlayer dielectric 150 can compose a tri-layered structure, but not limited thereto. This tri-layered structure, however, may also be replaced with another multi-layered structure consisting of at least a layer of organic material.

After the step shown in FIG. 3, the mask structure on the surface of the first interlayer dielectric 150 may be further patterned according to the position of the underlying gate electrode 212. Because the bottom of the patterned mask has a width equal to or greater than the width of the gate electrode 212, the gate electrode 212 can be fully covered by the corresponding patterned mask.

Figure 4:
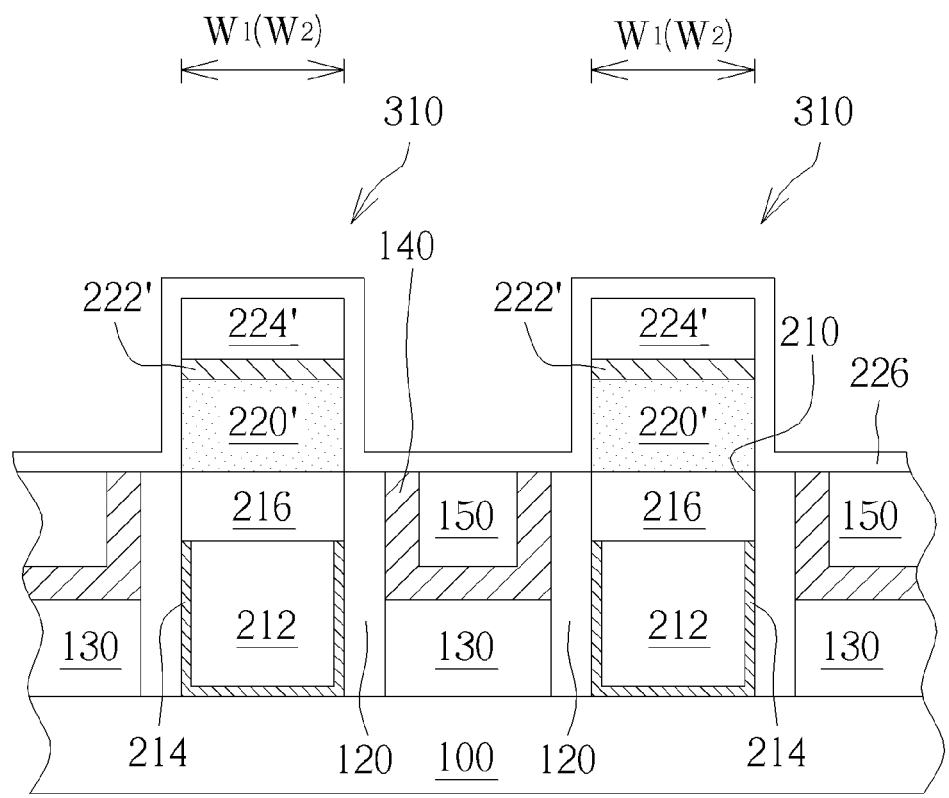
FIG. 4 is a schematic diagram showing a semiconductor structure after patterning a multi-layered structure on a substrate according to a first embodiment of the present invention.

The process of patterning the mask structure is further disclosed in the following paragraphs. Please refer to FIG. 4. FIG. 4 is a schematic diagram showing a semiconductor structure after patterning a multi-layered structure on a substrate. In a case where the mask structure consists of the organic dielectric layer 220, the anti-reflection layer 222 and the photoresist layer 224, the photoresist layer 224 is patterned through suitable photolithographic process so as to obtain a patterned photoresist 224' with a required pattern. The pattern of the patterned photoresist 224' may be further transferred to the underlying anti-reflection layer 222 and organic dielectric layer 220 so as to obtain a patterned anti-reflection layer 222' and a patterned organic dielectric layer 220'. Preferably, the patterned photoresist 224', the patterned anti-reflection layer 222' and the patterned organic dielectric layer 220' may have a width W2 greater than a width W1 of the underlying hard mask 216 as well as the width of the underlying gate electrode 212. Then, a dielectric layer 226 is blank deposited to conformally cover the surface of the patterned photoresist 224', the patterned anti-reflection layer 222' and the patterned organic dielectric layer 220'. The above-mentioned dielectric layer 226 may be formed through a proper depositing process such as chemical vapor deposition, plasma-enhanced chemical vapor deposition, atomic layer deposition, physical vapor deposition and so forth. The purpose of the dielectric layer 226 is to protect the patterned photoresist 224', the patterned anti-reflection layer 222' and the patterned organic dielectric layer 220' from damage caused in the subsequent processes.

Figure 5:
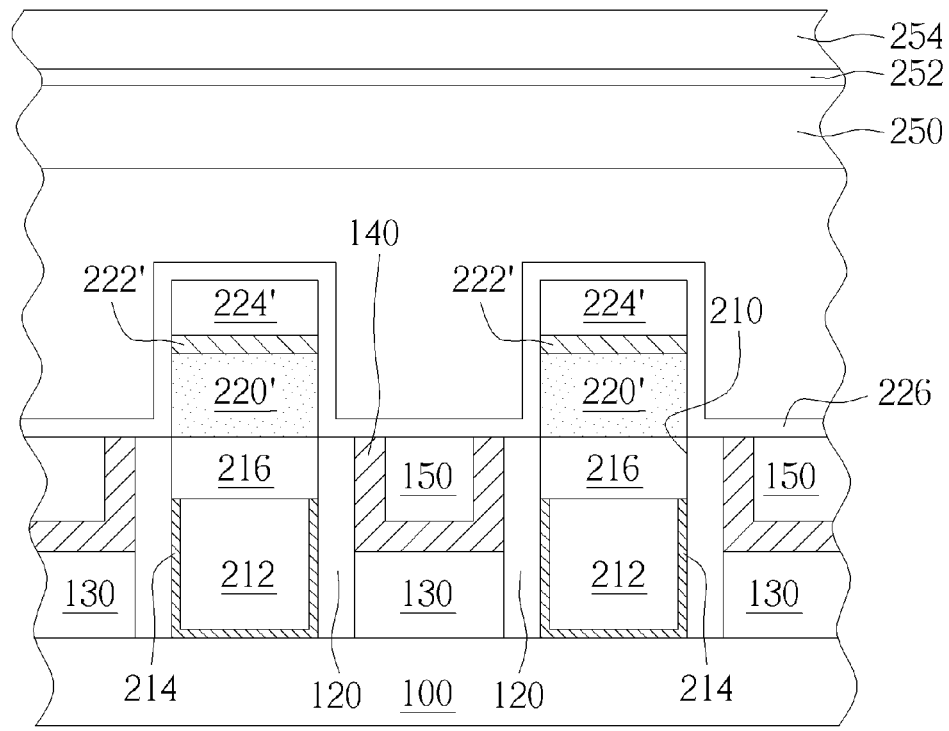
FIG. 5 is a schematic diagram showing a semiconductor structure after forming a second interlayer dielectric and a multi-layered structure according to a first embodiment of the present invention.

Please refer to FIG. 5. FIG. 5 is a schematic diagram showing a semiconductor structure after forming an interlayer dielectric and a multi-layered structure. After the step shown in FIG. 4, a second interlayer dielectric 240, such as a pre-metal dielectric (PMD), may be blankly deposited to completely cover the dielectric layer 226, the patterned photoresist 224', the patterned anti-reflection layer 222' and the patterned organic dielectric layer 220'. The composition of the second interlayer dielectric 240 may be the same as that of the first interlayer dielectric 150, such as a silicon oxide, so that there is the same or similar etching rate between them. Then, a multi-layered structure such as a structure including an organic dielectric layer (ODL) 250, an anti-reflective layer 252 and a photoresist layer 254 sequentially stacked from bottom to top is coated on the surface of the second interlayer dielectric 240.

Figure 6:
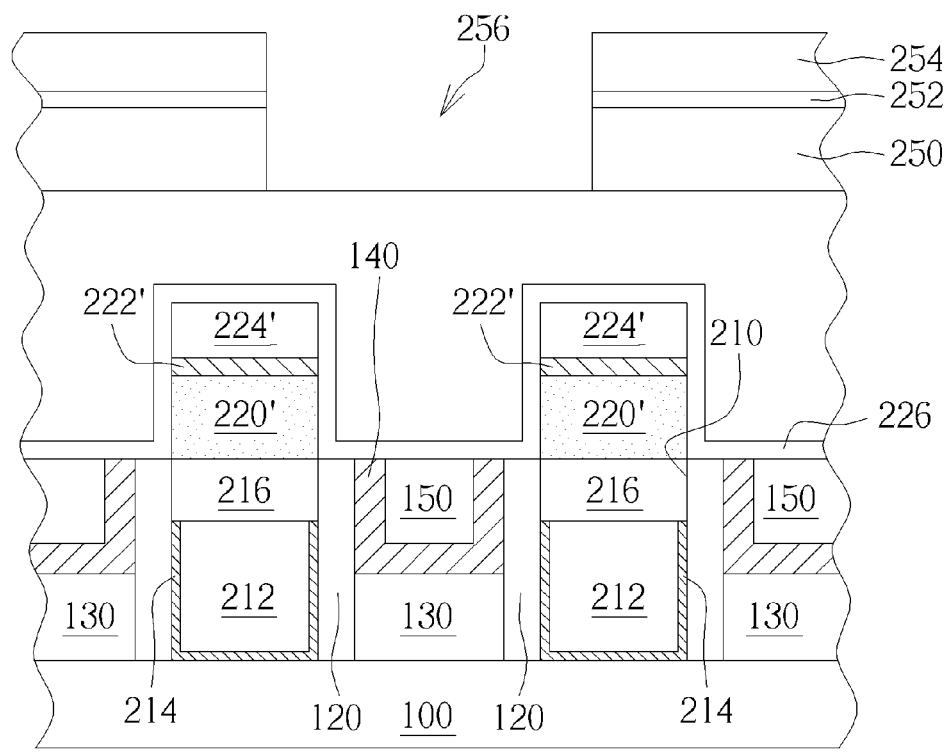
FIG. 6 is a schematic diagram showing a semiconductor structure after forming a patterned multi-layered structure according to a first embodiment of the present invention.

Please refer to FIG. 6. FIG. 6 is a schematic diagram showing a semiconductor device after forming a patterned multi-layered structure. Then, a feature pattern 256 such as a contact hole opening is then defined in the photoresist layer 254 through a suitable photolithographic process. The feature pattern 256 can be further transferred to the underlying anti-reflective layer 252 and ODL 250 by using the photoresist layer 254 as an etch mask. Additionally, the photolithographic process and/or the etching process preferably adopt a double patterning technology (DPT), but not limited thereto.

Afterwards, the feature pattern 256 defined in the photoresist layer 254, the anti-reflective layer 252 and ODL 250 can be further transferred to the second interlayer dielectric 240 through suitable etching processes.

Figure 7:
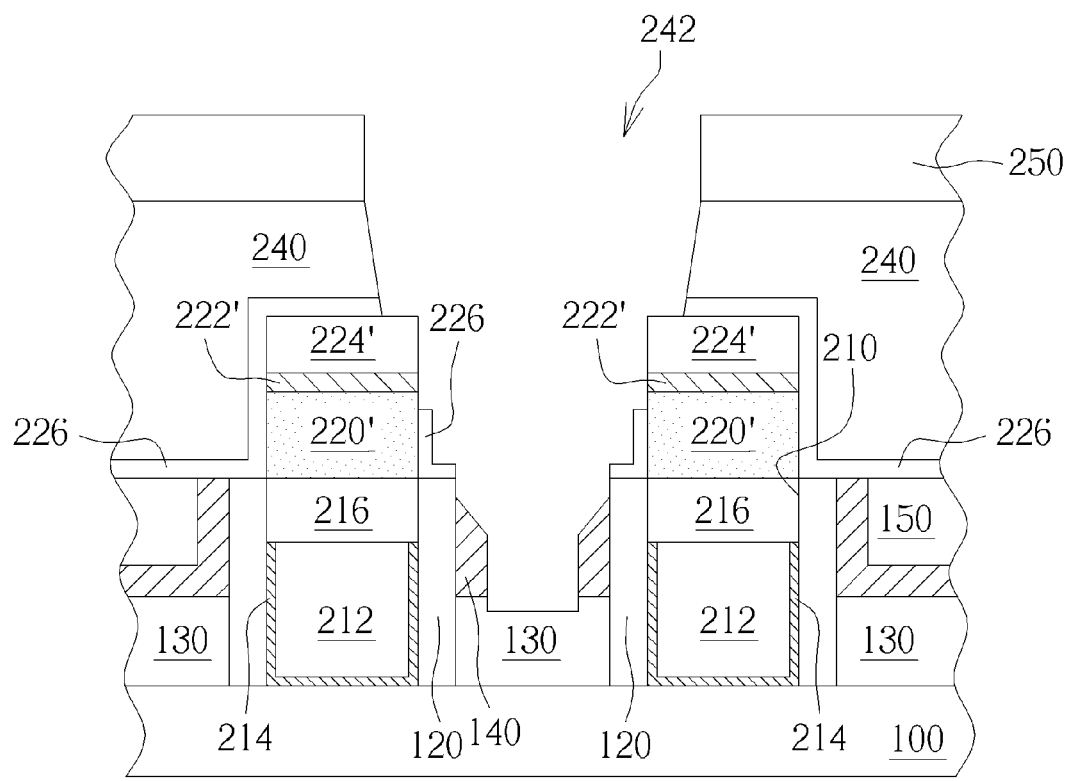
FIG. 7 is a schematic diagram showing a semiconductor structure after forming a contact hole according to a first embodiment of the present invention.

Please refer to FIG. 7. FIG. 7 is a schematic diagram showing a semiconductor device after forming a contact hole. A contact hole 242 is formed in the second interlayer dielectric 240 and the first interlayer dielectric 150 through suitable etching processes. During the etching processes, the photoresist layer 254 and the anti-reflective layer 252 above the ODL 250 may be completely removed, and the epitaxial layer 130 at the bottom of the contact hole 242 can be exposed.

It should be noted that, because the compositions of the patterned photoresist 224', the patterned anti-reflection layer 222' and the patterned organic dielectric layer 220' are organic materials instead of inorganic materials, the etching rates of these layers in the etching process can be much lower than the etching rates of the gate spacers 120, the etch stop layer 140, the second interlayer dielectric 240 and the first interlayer dielectric 150. Therefore, only a small amount of the patterned photoresist 224', the patterned anti-reflection layer 222' and the patterned organic dielectric layer 220' is removed during the etching process. Accordingly, because the gate electrode 212 is protected by the patterned photoresist 224', the patterned anti-reflection layer 222' and the patterned organic dielectric layer 220', only the epitaxial layer 130 or the substrate 100 can be exposed from the bottom of the contact hole 242 even if there is a misalignment during the photolithographic process. The etchants applied in the above-mentioned etching process may be chosen from suitable gas etchants such as $C_4F_6$, $C_5F_8$, $O_2$, Ar, CO, $CH_2F_2$ or the mixture thereof, but not limited thereto.

Figure 8:
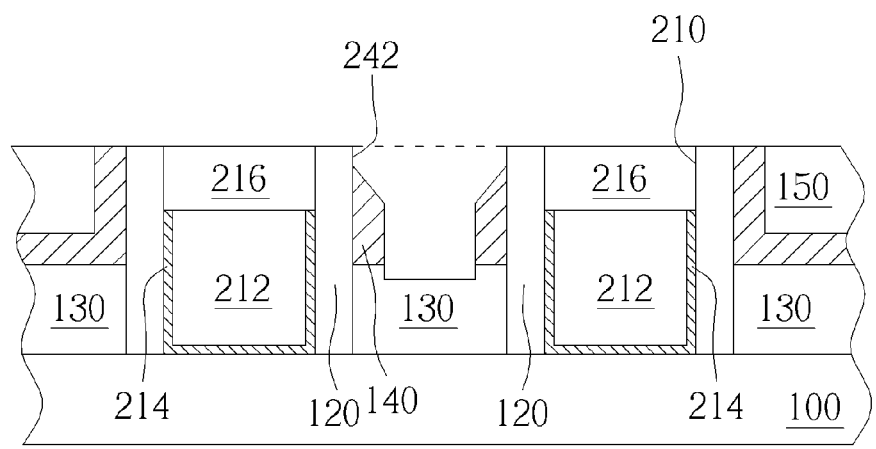
FIG. 8 and FIG. 9 are schematic diagrams showing a semiconductor structure after the step of forming a contact structure according to a first embodiment of the present invention.

Afterwards, the ODL 250, the second interlayer dielectric 240, the dielectric layer 226, the patterned photoresist 224', the patterned anti-reflection layer 222' and the patterned organic dielectric layer 220' can be removed completely so as to obtain a structure shown in FIG. 8.

Figure 9:
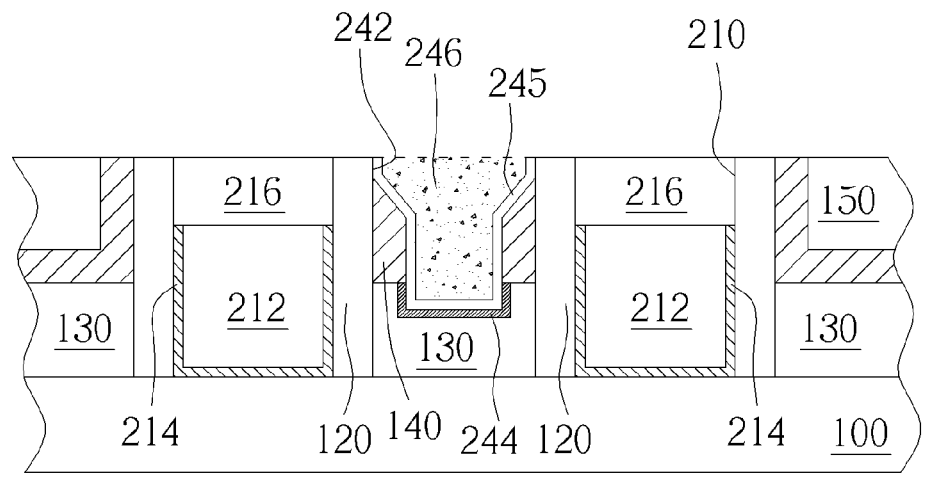

Please refer to FIG. 9. FIG. 9 is a schematic diagram showing a semiconductor structure after the step of forming a contact structure. After the step shown in FIG. 8, a self-aligned silicidation process is carried out to form a metal silicide 244 in the epitaxial layer 130. Afterwards, a conformal barrier layer 245 and a metal layer 246 are sequentially deposited on the surface of the first interlayer dielectric 150 and filled into the contact hole 242. A planarization process such as CMP is then carried out to remove the barrier layer 245 and the metal layer 246 outside the contact hole 242. Therefore, a self-aligned contact structure 243 is formed in the contact hole 242.

It should be noted that, although the ODL 250, the second interlayer dielectric 240, the dielectric layer 226, the patterned photoresist 224', the patterned anti-reflection layer 222' and the patterned organic dielectric layer 220' disclosed in the preceding embodiment are removed before the step of filling the conformal barrier layer 245 and the metal layer 246 into the contact hole 242, these layers may also be removed after the step of filling the conformal barrier layer 245 and the metal layer 246 into the contact hole 242.

The above-mentioned metal silicide 244 may be a silicide and metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt) or alloys of which. The metal layer 246 may be selected from the group consisting of tungsten (W), aluminum (Al), titanium (Ti), copper (Cu), molybdenum (Mo), cobalt (Co), platinum (Pt) or alloys of which. The barrier layer 245 includes titanium nitride (TiN), tantalum nitride (TaN), Ti/TiN or Ta/TaN, but not limited thereto.

According to the first preferred embodiment, the patterned photoresist 224', the patterned anti-reflection layer 222' and the patterned organic dielectric layer 220' made of organic materials are disposed on the gate electrode 212 to protect the gate electrode from etching. Because the compositions of the patterned photoresist 224', the patterned anti-reflection layer 222' and the patterned organic dielectric layer 220' are organic materials instead of inorganic materials, the etching rates of these layers in the etching process can be much lower than the etching rates of the gate spacers 120, the etch stop layer 140, the second interlayer dielectric 240 and the first interlayer dielectric 150. Therefore, only a small amount of the patterned photoresist 224', the patterned anti-reflection layer 222' and the patterned organic dielectric layer 220' is removed during the etching process. Accordingly, only the epitaxial layer 130 or the substrate 100 can be exposed from the bottom of the contact hole 242 even if there is a misalignment during the photolithographic process.

In the following paragraphs, several modifications of the present invention are disclosed. For the sake of clarity, only the main difference between modifications and the first preferred embodiment is described, the same or similar processes or structures may refer back to the previously described first preferred embodiment.

Figure 10:
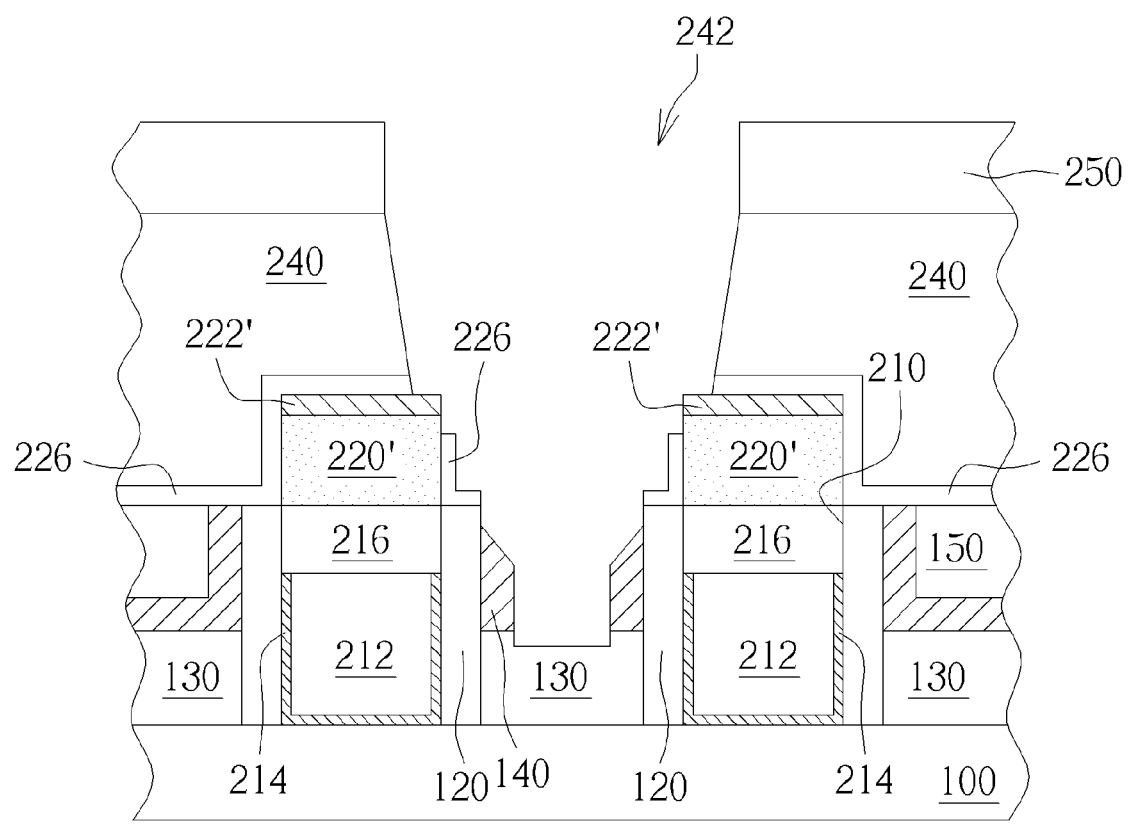
FIG. 10 is a schematic diagram showing a semiconductor structure after forming a contact hole according to a first modification embodiment of the present invention.

Please refer to FIG. 10. FIG. 10 is a schematic diagram showing a semiconductor device after forming a contact hole according to a first modification embodiment of the present invention. The main difference between the modification embodiment and the first embodiment is that the patterned photoresist 224' disclosed in the modification embodiment is removed before the process of depositing the dielectric layer 226. Therefore, only the dielectric layer 226, the patterned anti-reflection layer 222' and the patterned organic dielectric layer 220' can be used to protect the underlying metal gate electrode 212 from etching during the process of forming contact hole 242. Since other characteristics and advantages of the present modification embodiment are all similar to those described in the first preferred embodiment, their description is therefore omitted for the sake of clarity.

Figure 11:
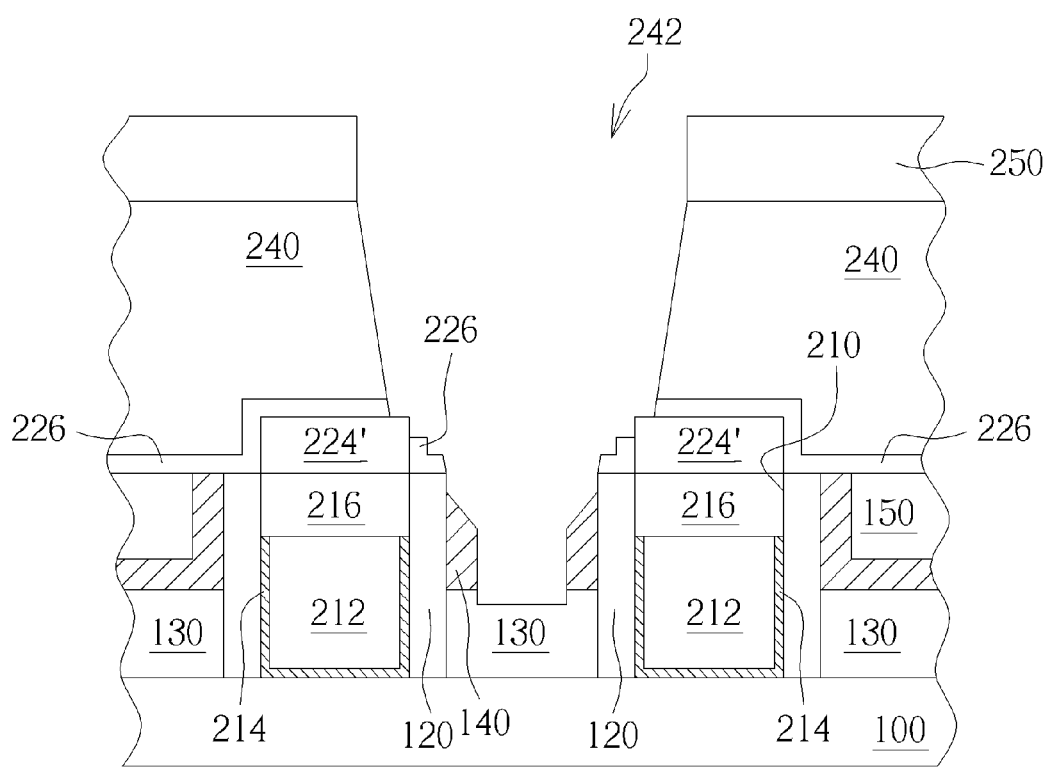
FIG. 11 is a schematic diagram showing a semiconductor structure after forming a contact hole according to a second modification embodiment of the present invention.

Please refer to FIG. 11. FIG. 11 is a schematic diagram showing a semiconductor device after forming a contact hole according to a second modification embodiment of the present invention. The main difference between this modification embodiment and the first embodiment is that the patterned photoresist 224' disclosed in the modification embodiment is directly disposed on the hard mask 216. That is to say, the patterned anti-reflection layer and the patterned organic dielectric layer disclosed in the first embodiment are not formed in the second modification embodiment. Therefore, only the patterned photoresist 224' and the conformal dielectric layer 226 are used to protect the underlying metal gate electrode 212 from etching during the process of forming contact hole 242. Since other characteristics and advantages of the present modification embodiment are all similar to those described in the first preferred embodiment, their description is therefore omitted for the sake of clarity.

Although only the transistor device is described in all of the embodiments of the present invention, it will be apparent that the present invention may be also applied to other types of semiconductor devices without departing from the scope and spirit of the present invention. For example, a portion of or all the metal gate structures may be replaced with resistor structures, capacitor structures, e-fused structures or other semiconductor devices. In other words, the self-aligned contact structure does not have to be landed between two adjacent metal gate structures, it also may land between two adjacent resistor structures or between a resistor structure and a metal gate structure, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor structure, comprising:
    forming a dummy gate electrode on the substrate;
    forming a first interlayer dielectric on a substrate after the step of forming the dummy gate electrode;
    removing the dummy gate electrode to leave a trench in the first interlayer dielectric;
    forming a gate electrode in the trench, wherein a periphery of the gate electrode is surrounded by the first interlayer dielectric;
    forming a hard mask on a top surface of the gate electrode;
    forming a patterned mask layer comprising at least a layer of organic material on the gate electrode after the step of forming the hard mask;
    forming a conformal dielectric layer to conformally cover the layer of organic material; and
    forming a second interlayer dielectric to cover the conformal dielectric layer.

2. The method of claim 1, wherein the step of forming the patterned mask layer comprises:
    coating a photoresist layer on the first interlayer dielectric; and
    patterning the photoresist layer so as to form a patterned photoresist.

3. The method of claim 1, wherein the step of forming the patterned mask layer further comprises:
    coating an organic dielectric layer on the first interlayer dielectric;
    coating an anti-reflection layer on the organic dielectric layer;
    coating a photoresist layer on the anti-reflection layer;
    patterning the photoresist layer so as to form a patterned photoresist; and
    etching the anti-reflection layer by using the patterned photoresist layer as etch mask so as to form a patterned anti-reflection layer.

4. The method of claim 3, after the step of etching the anti-reflection layer, further comprising etching the organic dielectric layer by using the patterned photoresist layer as etch mask so as to form a patterned organic dielectric layer.

5. The method of claim 4, wherein the conformal dielectric layer conformally covers the patterned photoresist, the patterned anti-reflection layer and the patterned organic dielectric layer.

6. The method of claim 4, further comprising removing the patterned photoresist after the step of etching the organic dielectric layer.

7. The method of claim 6, wherein the conformal dielectric layer conformally cover the patterned organic dielectric layer during the step of forming the second interlayer dielectric.

8. The method of claim 2, further comprising forming a contact hole in the first interlayer dielectric and the second interlayer dielectric so as to expose portions of the patterned mask layer.

9. The method of claim 8, further comprising removing the second interlayer dielectric and the patterned photoresist after the step of forming the contact hole.

10. The method of claim 8, further comprising forming a contact structure in the contact hole.

11. The method of claim 10, wherein the step of forming the contact structure comprises:
    conformally forming a barrier layer on sidewalls of the contact hole; and
    filling up the contact hole with a metal layer.

12. The method of claim 1, wherein the hard mask is disposed on top surface of the gate electrode during the step of forming the second interlayer dielectric.

13. The method of claim 2, wherein a width of the hard mask is less than a width of the patterned photoresist.

14. The method of claim 1, further comprising:
    forming gate spacers respectively disposed on sidewalls of the dummy gate electrode; and
    depositing an etch stop layer conformally disposed on the gate spacers before the step of forming the first interlayer dielectric.

* * * * *